United States Patent
Yang et al.

(10) Patent No.: US 11,594,175 B2
(45) Date of Patent: Feb. 28, 2023

(54) ORGANIC LIGHT EMITTING DISPLAY DEVICE AND DRIVING METHOD THEREOF

(71) Applicant: Samsung Display Co., Ltd., Yongin-si (KR)

(72) Inventors: Ji-Yeon Yang, Yongin-si (KR); Geun-Young Jeong, Yongin-si (KR); Takeshi Kato, Yongin-si (KR); Myung-Ho Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/580,484

(22) Filed: Jan. 20, 2022

(65) Prior Publication Data

US 2022/0157260 A1    May 19, 2022

Related U.S. Application Data

(63) Continuation of application No. 17/529,218, filed on Nov. 17, 2021, which is a continuation of application No. 17/102,312, filed on Nov. 23, 2020, now Pat. No. 11,380,253, which is a continuation of application No. 16/207,023, filed on Nov. 30, 2018, now Pat. No. 10,878,746, which is a continuation of application
(Continued)

(51) Int. Cl.
  *G09G 3/3208* (2016.01)
  *G09G 3/20* (2006.01)
  *G09G 3/3275* (2016.01)

(52) U.S. Cl.
  CPC ............. *G09G 3/3208* (2013.01); *G09G 3/20* (2013.01); *G09G 3/3275* (2013.01); *G09G 2300/0452* (2013.01); *G09G 2300/0465* (2013.01); *G09G 2310/027* (2013.01); *G09G 2310/0232* (2013.01); *G09G 2320/0242* (2013.01); *G09G 2320/0646* (2013.01)

(58) Field of Classification Search
  CPC ............................. G09G 3/3208; G09G 3/20
  See application file for complete search history.

(56) References Cited

U.S. PATENT DOCUMENTS 4,491,863 A    1/1985   Kurahashi
4,642,619 A    2/1987   Togashi
(Continued)

FOREIGN PATENT DOCUMENTS

CN    101551566 A    10/2009
JP    2000-020025 A    1/2000
(Continued)

OTHER PUBLICATIONS

Chinese Office Action dated Dec. 2, 2016 for Chinese Patent Application No. CN 201310181186.0, and which shares priority of Korean Patent Application No. KR 10-2012-0100881 with subject U.S. Appl. No. 13/752,154.
(Continued)

*Primary Examiner* — Mark Edwards
*Assistant Examiner* — Chayce R Bibbee
(74) *Attorney, Agent, or Firm* — Lewis Roca Rothgerber Christie LLP

(57) ABSTRACT

An organic light emitting display device and a driving method thereof are disclosed. The display device has sub-pixels of multiple colors. In one aspect, the organic light emitting display device detects sub-pixels which are positioned at the edges of the panel. Data for the sub-pixels on the edges are reduced so that colors on the edges are less observable.

30 Claims, 5 Drawing Sheets

Related U.S. Application Data

No. 13/752,154, filed on Jan. 28, 2013, now Pat. No. 10,147,351.

(56) References Cited

U.S. PATENT DOCUMENTS

| | | |
|---|---|---|
| 6,522,356 B1 | 2/2003 | Watanabe |
| 6,867,549 B2 | 3/2005 | Cok et al. |
| 7,123,277 B2 | 10/2006 | Brown Elliott et al. |
| 7,215,347 B2 | 5/2007 | Phan |
| 7,274,383 B1 | 9/2007 | Brown Elliot |
| 7,525,526 B2 | 4/2009 | Elliott et al. |
| 7,612,811 B2 | 11/2009 | Takeuchi et al. |
| 7,755,652 B2 | 7/2010 | Credelle et al. |
| 8,350,468 B2 | 1/2013 | Ko et al. |
| 8,519,910 B2 | 8/2013 | Park et al. |
| 2003/0128179 A1 | 7/2003 | Credelle |
| 2005/0078104 A1 | 4/2005 | Matthies et al. |
| 2005/0225575 A1 | 10/2005 | Brown Elliott et al. |
| 2006/0152531 A1 | 7/2006 | Lin et al. |
| 2007/0035557 A1 | 2/2007 | Choe et al. |
| 2008/0308819 A1 | 12/2008 | Louwsma et al. |
| 2009/0141045 A1 | 6/2009 | Jackson |
| 2009/0302331 A1 | 12/2009 | Smith et al. |
| 2010/0045695 A1 | 2/2010 | Brown Elliott et al. |
| 2010/0091030 A1 | 4/2010 | Park et al. |
| 2010/0133994 A1 | 6/2010 | Song et al. |
| 2010/0149204 A1 | 6/2010 | Han |
| 2010/0164978 A1 | 7/2010 | Brown Elliott et al. |
| 2010/0171440 A1 | 7/2010 | Satou et al. |
| 2011/0012820 A1 | 1/2011 | Kim et al. |
| 2011/0260951 A1 | 10/2011 | Hwang et al. |
| 2011/0267376 A1 | 11/2011 | Park |
| 2011/0291549 A1 | 12/2011 | Kim et al. |
| 2012/0026216 A1 | 2/2012 | Brown Elliott et al. |
| 2012/0119980 A1 | 5/2012 | Joffer et al. |
| 2012/0162156 A1 | 6/2012 | Chen et al. |
| 2012/0319564 A1 | 12/2012 | Ghosh et al. |
| 2013/0002911 A1 | 1/2013 | Miyashita et al. |

FOREIGN PATENT DOCUMENTS

| | | |
|---|---|---|
| JP | 2004-004822 A | 1/2004 |
| KR | 10-2004-0019353 A | 3/2004 |
| KR | 10-2004-0080442 A | 9/2004 |
| KR | 10-2004-0096706 A | 11/2004 |
| KR | 10-2005-0059647 A | 6/2005 |
| KR | 10-0888983 B1 | 3/2009 |
| KR | 10-2009-0068591 A | 6/2009 |
| KR | 10-2009-0122307 A | 11/2009 |
| KR | 10-0926635 B1 | 11/2009 |
| KR | 10-2010-0041583 A | 4/2010 |
| KR | 10-2011-0046544 A | 5/2011 |
| KR | 10-2011-0121891 A | 11/2011 |
| KR | 10-2011-0131540 A | 12/2011 |
| KR | 10-1332495 B1 | 11/2013 |
| KR | 10-1894326 B1 | 10/2018 |

OTHER PUBLICATIONS

Taiwan Office Action dated Sep. 5, 2016 for Taiwan Patent Application No. TW 102110843 which shares priority of Korean Patent Application No. KR 10-2012-0100881 with subject U.S. Appl. No. 13/752,154.

Extended European Search Report dated Sep. 5, 2013 for European Patent Application No. EP 13 167 352.7 which shares priority of Korean Patent Application No. KR 10-2012-0100881 with captioned U.S. Appl. No. 13/752,154.

Notice of Allowance dated Feb. 16, 2022 for corresponding Korean Application No. 10-2021-0012813 (2 pages).

Office Action dated Jul. 31, 2014 from corresponding U.S. Appl. No. 13/752,154 (12 pages).

Office Action dated Jan. 30, 2015 from corresponding U.S. Appl. No. 13/752,154 (13 pages).

Office Action dated Oct. 21, 2015 from corresponding U.S. Appl. No. 13/752,154 (15 pages).

Office Action dated Apr. 24, 2019 from corresponding U.S. Appl. No. 16/207,023 (10 pages).

Office Action dated Oct. 31, 2019 from corresponding U.S. Appl. No. 16/207,023 (13 pages).

Advisory Action dated Jun. 3, 2015, for related U.S. Appl. No. 13/752,154 (3 pages).

Final Office Action dated May 19, 2016, for related U.S. Appl. No. 13/752,154 (18 pages).

Notice of Allowance dated Jul. 27, 2018, for related U.S. Appl. No. 13/752,154 (9 pages).

Advisory Action dated Feb. 18, 2020, for related U.S. Appl. No. 16/207,023 (3 pages).

Notice of Allowance dated Apr. 9, 2020, for related U.S. Appl. No. 16/207,023 (9 pages).

Notice of Allowance dated Aug. 21, 2020, for related U.S. Appl. No. 16/207,023 (9 pages).

Notice of Allowance dated Apr. 6, 2022, for related U.S. Appl. No. 17/102,312 (8 pages).

ORGANIC LIGHT EMITTING DISPLAY DEVICE AND DRIVING METHOD THEREOF

CROSS-REFERENCE TO RELATED APPLICATIONS

This application is a continuation of U.S. patent application Ser. No. 17/529,218, filed Nov. 17, 2021, which is a continuation of U.S. patent application Ser. No. 17/102,312, filed Nov. 23, 2020, now U.S. Pat. No. 11,380,253, which is a continuation of U.S. patent application Ser. No. 16/207,023, filed Nov. 30, 2018, now U.S. Pat. No. 10,878,746, which is a continuation of U.S. patent application Ser. No. 13/752,154, filed Jan. 28, 2013, now U.S. Pat. No. 10,147,351, which claims priority to and the benefit of Korean Patent Application No. 10-2012-0100881, filed Sep. 12, 2012, the entire content of all of which is incorporated herein by reference.

BACKGROUND

Field

The disclosed technology relates to an organic light emitting display device and a driving method thereof, and more particularly, to an organic light emitting display device and a driving method thereof having high image quality.

Description of the Related Technology

An organic light emitting display (OLED) device is used to display an image using organic light emitting diodes that are self-luminescent elements. Such a display device is widely used as a next-generation display device because of its excellent luminance and color purity.

In display devices, pixels include red sub-pixels, green sub-pixels and blue sub-pixels, and accordingly, various color images are displayed.

The red sub-pixels, the green sub-pixels and the blue sub-pixels may be arranged in various configurations. The red sub-pixels, the green sub-pixels and the blue sub-pixels are generally arranged linearly, for example, such that sub-pixels of the same color are arranged in a column.

If the sub-pixels are linearly arranged, an aperture ratio is reduced by black non-emitting structure positioned between the respective sub-pixels, and the ability to display a high-resolution image is degraded.

To solve such a problem, "ClairVoyante Laboratories Inc." has proposed a pixel arrangement structure, entitled as "The Pentile Matrix Color Pixel Arrangement." In the Pentile matrix color pixel arrangement, red and blue sub-pixels are alternately formed on the same column, and green sub-pixels are formed on an adjacent column. Furthermore, color pixel arrangement, the number of sub-pixels is decreased to approximately ⅔ of that in the linear arrangement, a high aperture ratio is achieved. Such an arrangement may be applied in an OLED display device to display a high-resolution image and to improve image quality by using a structure in which does use the linear arrangement. However, in the Pentile arrangement, green and red colors are seen as lines (greenish and pinkish) at edges of the OLED display device.

SUMMARY OF CERTAIN INVENTIVE ASPECTS

One inventive aspect is an organic light emitting display device. The display device includes a pixel unit having a plurality of sub-pixels, a scan driver configured to drive scan lines coupled to the sub-pixels, a data driver configured to drive data lines coupled to the sub-pixels and positioned in a direction intersecting the scan lines, and a data processor configured to receive a first data and to generate a second data based on the first data. The data processor generates the second data by changing grayscale values of the first data for sub-pixels positioned at edges of the pixel unit.

Another inventive aspect is a method of driving an organic light emitting display device. The method includes sensing a sub-pixel color arrangement of a display panel, and generating second data by changing grayscale values of first data to be supplied to sub-pixels positioned at edges of the panel, according to the sub-pixel color arrangement.

BRIEF DESCRIPTION OF THE DRAWINGS

The accompanying drawings, together with the specification, illustrate exemplary embodiments, and, together with the description, serve to explain certain inventive features, aspects, and principles.

DETAILED DESCRIPTION OF CERTAIN INVENTIVE EMBODIMENTS

Figure 1:
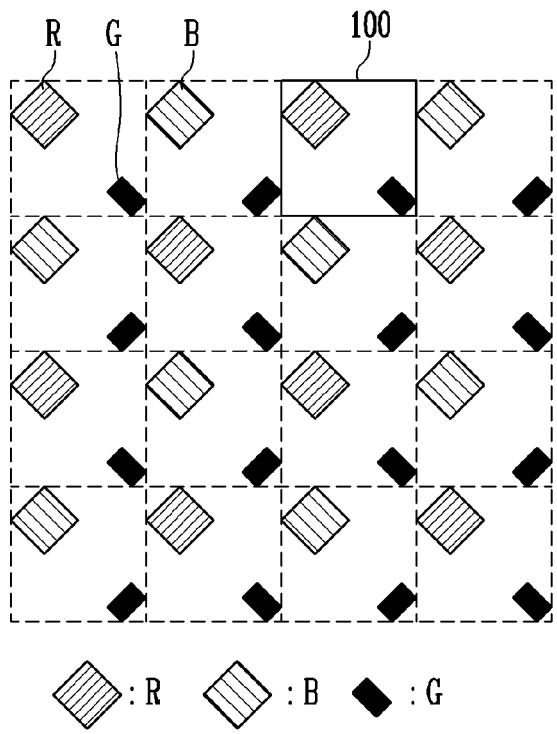
FIG. 1 is a view illustrating a pixel arrangement structure of an organic light emitting display device according to an embodiment.

Hereinafter, certain exemplary embodiments are described with reference to the accompanying drawings. Here, when a first element is described as being coupled to a second element, the first element may be directly coupled to the second element or may be indirectly coupled to the second element via a third element. Further, some of the elements that are not essential to the complete understanding are omitted for clarity. Also, like reference numerals generally refer to like elements throughout.

FIG. 1 is a view illustrating a pixel arrangement structure of an organic light emitting display device according to an embodiment. Referring to FIG. 1, in the organic light emitting display device according to this embodiment, red and blue sub-pixels R and B are repetitively arranged on a particular column, and a green sub-pixel is repetitively arranged adjacent to the particular column. That is, the sub-pixels R, G and B are arranged in a Pentile matrix form.

Red and green sub-pixels R and G or blue and green sub-pixels B and G are arranged in each pixel region 100. In each pixel region 100, the red and green sub-pixels R and G are positioned in a diagonal direction. In this case, the interval between the red and green sub-pixels R and G may be a high-resolution panel. Similarly, the blue and green sub-pixels B and G are also positioned in a diagonal direction. Meanwhile, in some embodiments of the organic light emitting display device, the sub-pixels R, G, B and G positioned in two adjacent pixel regions 100 constitute one pixel to be driven.

In the pixel arrangement structure of some embodiments, the green sub-pixel G may be formed to have a narrower area than the red and blue sub-pixels R and B, in consideration of light emitting efficiency. The blue sub-pixel B may be formed to have a wider area than the red sub-pixel R, in consideration of the light emitting efficiency. The areas of the sub-pixels R, G and B may be changed in consideration of the light emitting efficiency.

Figure 2A:
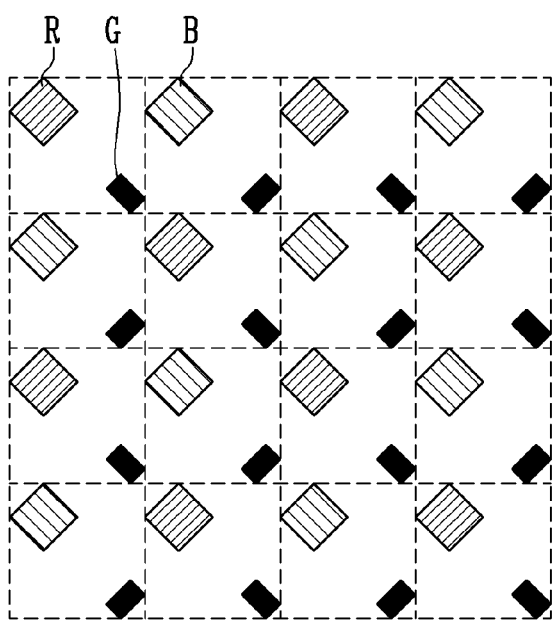
FIGS. 2A to 2D are views illustrating patterns of data corresponding to positions of a panel.
Figure 2B:
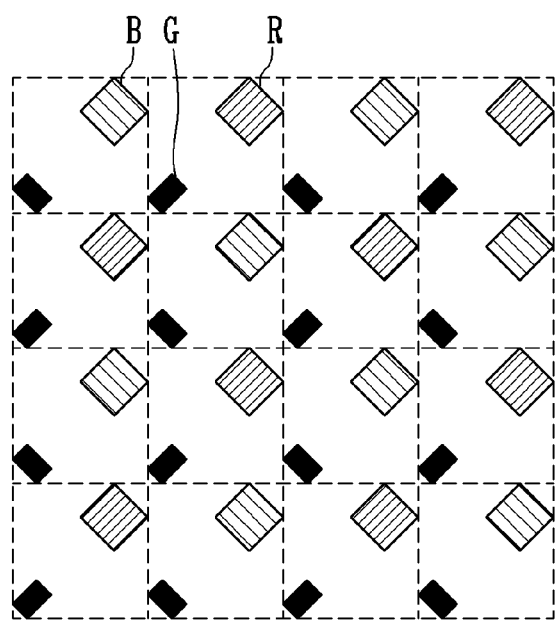
Figure 2C:
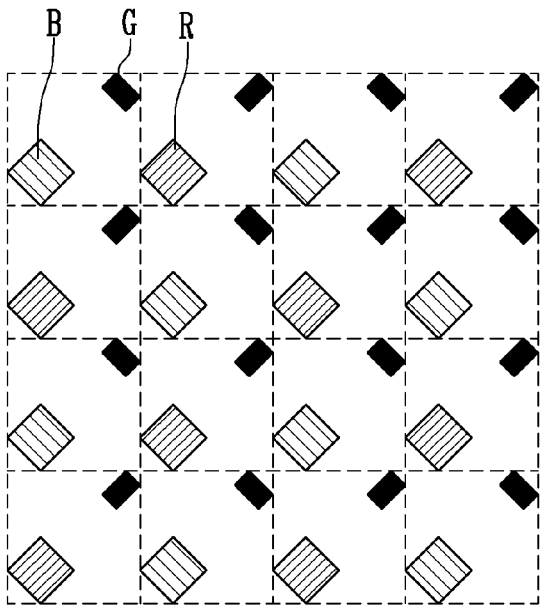
Figure 2D:
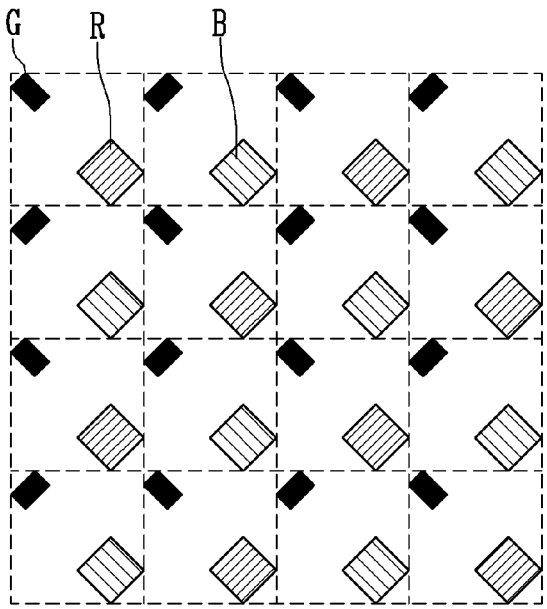

Meanwhile, in a case where a panel having the pixel arrangement structure of some embodiments is used in a portable device, data is changed and supplied depending on a change in position of the panel. For example, in a case where the panel is driven at a normal position, the data is supplied in a first pattern (R, G, B, G, . . . ) as shown in FIG. 2A. In a case where the panel is rotated to the left side at 90 degrees, the data is supplied in a second pattern (G, B, G, R, . . . ) as shown in FIG. 2B. In a case where the panel is rotated to the right side at 90 degrees, the data is supplied in a third pattern (B, G, R, G, . . . ) as shown in FIG. 2C. In a case where the panel is vertically reversed, the data is supplied in a fourth pattern (G, R, G, B, . . . ) as shown in FIG. 2D. However, in the organic light emitting display device of some embodiments in which the sub-pixels are arranged in the Pentile matrix form, there is a problem in that one color is seen at an edge of the panel.

Figure 3A:
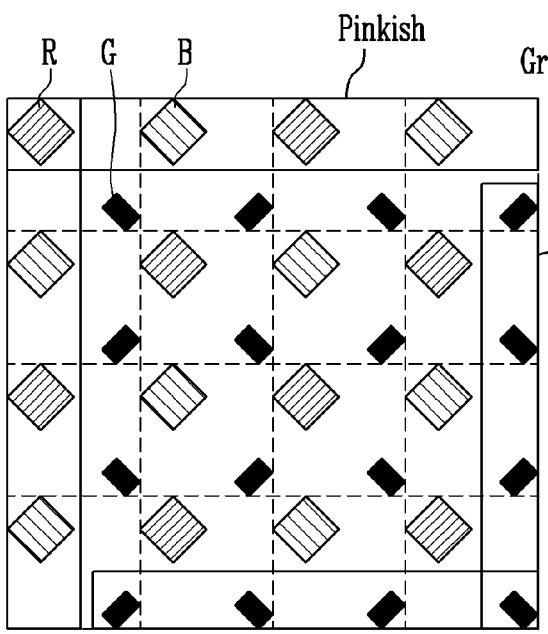
FIGS. 3A to 3D are views illustrating states in which specific colors are recognized in the form of lines, corresponding to positions of the panel.
Figure 3B:
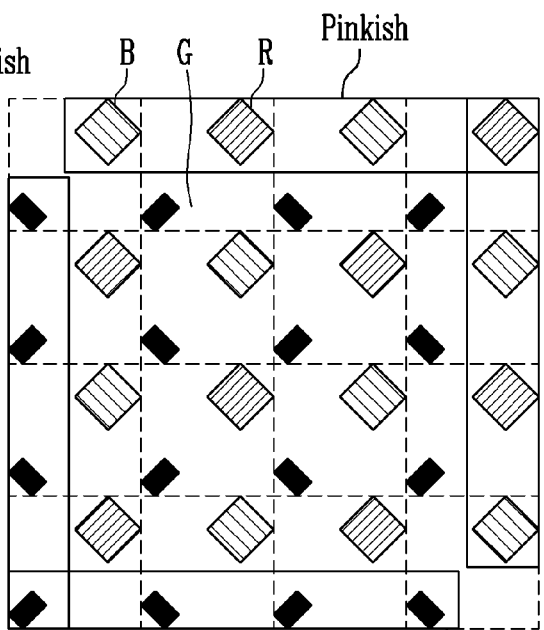
Figure 3C:
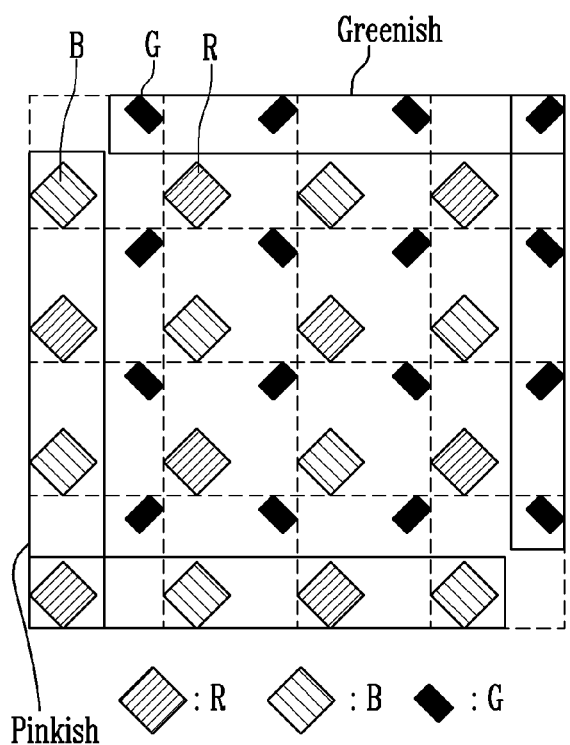
Figure 3D:
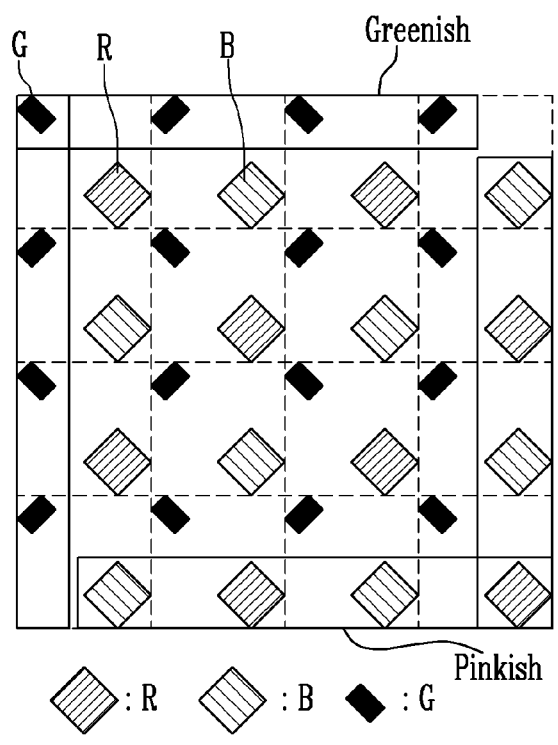

Practically, in a case where the data is input in the first pattern, as shown in FIG. 3A, a pinkish strip may be strongly recognized at upper and left edges, and a greenish stripe is strongly recognized at a right edge. Similarly, in a case where the data is supplied in the second to fourth patterns, pinkish and greenish stripes are strongly recognized at edges as shown in FIGS. 3B to 3D.

To solve such a problem, a dimming process may be performed on data supplied to sub-pixels R, G and B positioned at the edges of the panel. Here, the dimming process refers to a process of reducing the grayscale value of the data supplied to the edges of the panel so as to prevent the color from being strongly recognized along the edges.

Figure 4:
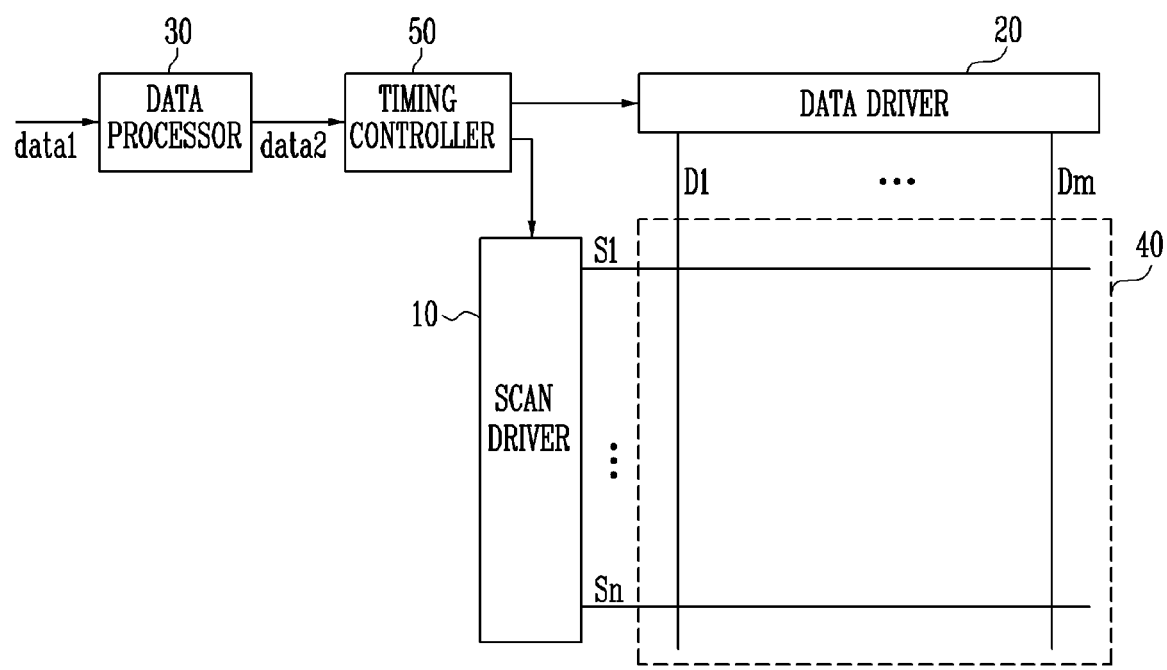
FIG. 4 is a block diagram illustrating an organic light emitting display device according to an embodiment.

FIG. 4 is a block diagram illustrating an organic light emitting display device according to an embodiment. Referring to FIG. 4, the organic light emitting display device according to this embodiment includes a scan driver 10 for driving scan lines S1 to Sn, a data driver 20 for driving data lines D1 to Dm, a timing controller 50 for controlling the scan driver 10 and the data driver 20, and a data processor 30 for generating a second data data2 by performing a dimming process on a first data data1 supplied from the outside thereof.

The sub-pixels R, G and B are arranged into a structure, as shown in FIG. 1, in a pixel unit 40 in which the scan lines S1 to Sn and the data lines D1 to Dm intersect with each other. The scan driver 10 supplies a scan signal to the scan lines S1 to Sn. Here, the scan driver 10 may supply the scan signal in a forward or reverse direction, corresponding to the position of a panel. The data driver 20 generates a data signal using the second data data2, and supplies the generated data signal to the data lines D1 to Dm in synchronization with the scan signal. Then, the data signal is supplied to sub-pixels R, G and B selected by the scan signal. The timing controller 50 supplies a control signal (not shown) for controlling the scan driver 10 and the data driver 20. The timing controller 50 provides, to the data driver 20, the second data data2 supplied from the data processor 30. The data processor 30 generates the second data data2 by detecting a pattern (one of the first to fourth patterns) of data and performing a dimming process on the first data data1, corresponding to the detected pattern. Practically, the data processor 30 generates the second data data2 by reducing the grayscale value of the first data data1 to be supplied outermost sub-pixels of the panel so that a specific color is not recognized at an edge of the panel. The detailed operation of the data processor 30 will be described later.

Figure 5:
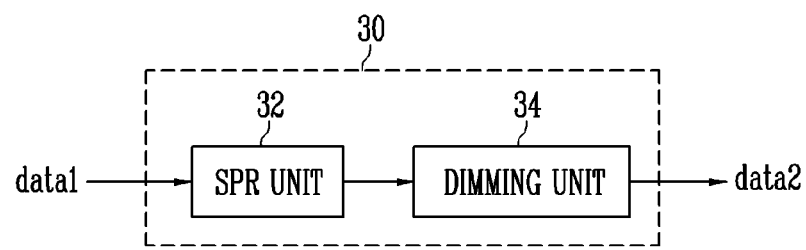
FIG. 5 is a block diagram illustrating a data processor according to an embodiment.

FIG. 5 is a block diagram illustrating the data processor according to an embodiment. Referring to FIG. 5, the data processor 30 according to this embodiment includes a sub-pixel rendering (SPR) unit 32 and a dimming unit 34.

The SPR unit 32 operates according to an algorithm for improving readability of characters, etc. Any one of various algorithms currently known in the art may be applied with the SPR unit 32 in conjunction with a Pentile pixel arrangement. Additionally, the SPR unit 32 may be omitted in some embodiments. The dimming unit 34 generates the second data data2 by controlling the grayscale values of the first data data1 to be supplied sub-pixels positioned at the outermost edges of the panel, corresponding to the pattern of data.

Figure 6:
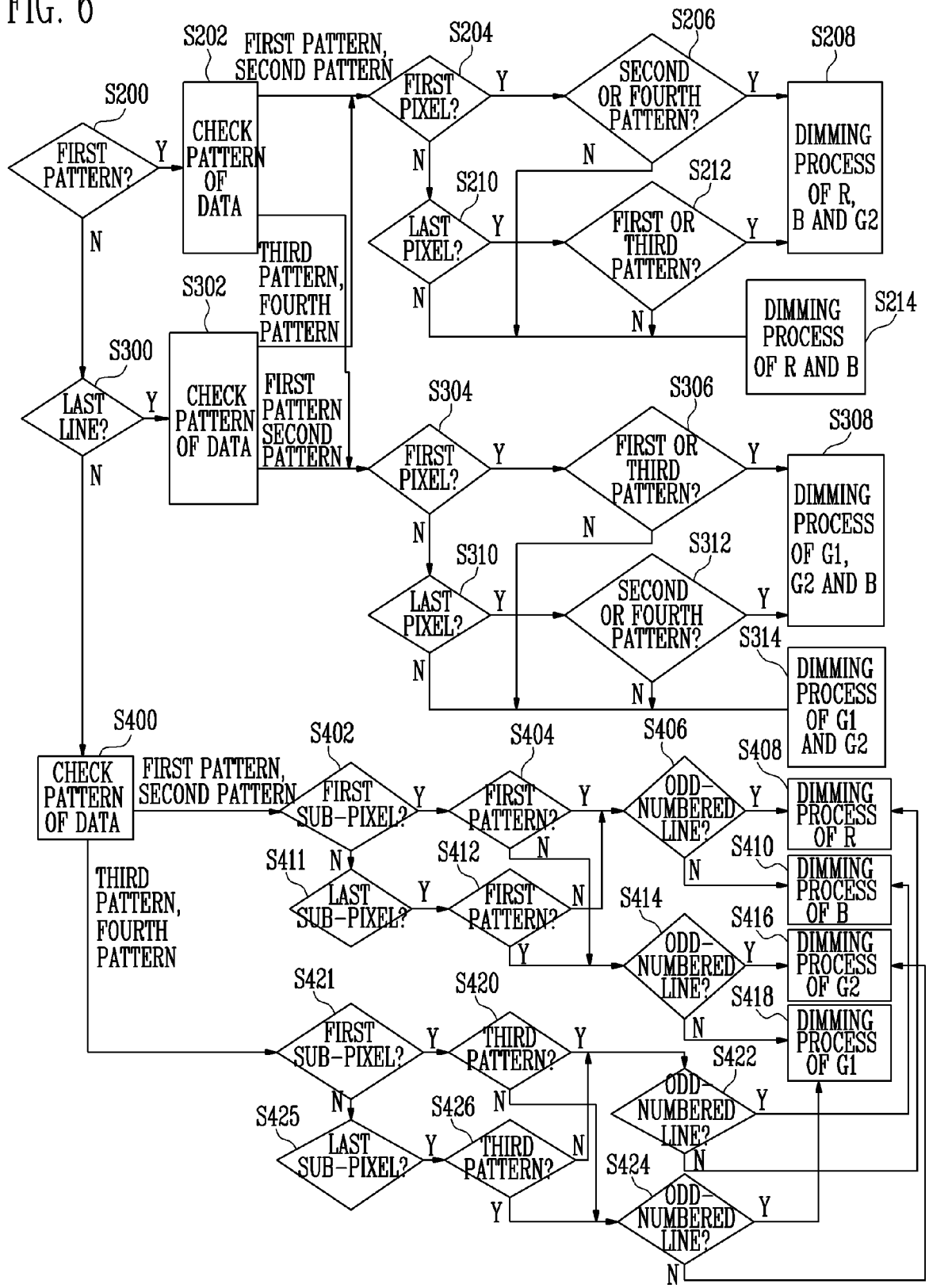
FIG. 6 is a flowchart illustrating an operation of a dimming unit according to an embodiment.

FIG. 6 is a flowchart illustrating a method of operating the dimming unit according to an embodiment. Referring to FIG. 6, the dimming unit 34 checks whether or not the first data data1 input thereto is a data of the first or last line. Practically, as shown FIGS. 3A to 3D, the first data data1 supplied to the first and last lines is generated as the second data data2 by performing a dimming process on the first data data1.

The dimming unit 34 generates the second data data2 by performing a dimming process on the first data data1 to be supplied to the first and last pixels positioned on each of the lines other than the first and last lines. That is, the dimming unit 34 generates the second data data2 by reducing the grayscale values of the first data data1 to be supplied to sub-pixels R, G and B positioned at edges of the panel, and supplies the generated second data data2 to the timing controller 50.

The operation of the dimming unit 34 will be described in further detail. The dimming unit 34 decides whether or not the first data data1 input from the outside thereof is a data to be supplied to the first line (S200). In a case where it is decided in step S200 that the first data data1 is the data to be supplied to the first line, the dimming unit 34 checks a pattern of the data pattern (S202). Here, the pattern of the data is divided into first, second, third and fourth patterns as shown in FIGS. 3A to 3D.

In a case where it is decided in step S202 that the pattern of the data is the first pattern, the dimming unit 34 decides whether or not the first data data1 is supplied to the first pixel of the first line (S204).

In a case where it is decided in step 204 that the first data data1 is supplied to the first pixel, the dimming unit 34 decides whether the pattern of the data is the second or fourth pattern (S206). Here, the pattern of the data has been decided as the first pattern in step S202, and hence the dimming unit 34 generates the second data data2 by performing a dimming process on the first data data1 to be supplied to red and blue sub-pixels R and B (S214) (dimming process of R and B positioned at upper edge/left edge of FIG. 3).

In a case where the first data data1 does not correspond to the first pixel in step S204, the dimming unit 34 decides whether or not the first data data1 is input to the last pixel of the first line (S210). If it is decided in step S210 that the first data data1 is supplied to the last pixel, the dimming unit 34 decides whether the pattern of the data is the first or third pattern (S212). Here, the pattern of the data has been decided as the first pattern in step S202, and hence the dimming unit 34 performs a dimming process on the first data data1 corresponding to red, blue and green sub-pixels R, B and G2 (dimming process of R, B and G positioned at upper edge/right edge of FIG. 3A). Here, that the green sub-pixel is designated by G2 means that the green sub-pixel is positioned in the same pixel region 100 as the blue sub-pixel B. For convenience of illustration, the green sub-pixel positioned in the same pixel region 100 as the red sub-pixel R is designated by G1. Meanwhile, in a case where it is decided in step S210 that the first data data1 is not input to the last pixel, i.e., in a case where the first data data1 is input to one of the pixels positioned between the first and last pixels, the dimming unit 34 performs a dimming process on the first data data1, corresponding to the red and blue sub-pixels R and B (S214). As described above, in a case where the data of the first pattern is input, the dimming unit 34 generates the second data data2 by performing a dimming process on the first data data1 corresponding to sub-pixels positioned at the upper edge while passing through steps S202 to S214.

In a case where it is decided in step S202 that the pattern of the data is the second pattern, the dimming unit 34 decides whether or not the first data data1 is supplied to the first pixel of the first line (S204).

If it is decided in step 204 that the first data data1 is supplied to the first pixel, the dimming unit 34 decides whether the pattern of the data is the second or fourth pattern (S206). Here, the pattern of the data has been decided as the second pattern in step S202, the dimming unit 34 generates the second data data2 by performing a dimming process on the first data data1 when the first data data1 is supplied to the red, blue and green sub-pixels R, B and G2 included in the first pixel (S208) (dimming process of R, B and G positioned at upper edge/left edge of FIG. 3B).

In a case where the first data data1 does not correspond to the first pixel in step S204, the dimming unit 34 decides whether or not the first data data1 is input to the last pixel (S210). In a case where it is decided in step S210 that the first data data1 is supplied to the last pixel, the dimming unit 34 decides whether the pattern of the data is the first or third pattern (S212). Here, the pattern of the data has been decided as the second pattern in step 202, and hence the dimming unit 34 performs a dimming process on the first data data1 corresponding to the red and blue sub-pixels R and B (S214) (dimming process of R and B positioned at upper edge/right edge of FIG. 3B). Meanwhile, in a case where it is not decided in step S210 that the first data data1 is input to the last pixel, i.e., in a case where the first data data1 is input to one of the pixels positioned between the first and last pixels, the dimming unit 34 performs a dimming process on the first data data1 corresponding to the red and blue sub-pixels R and B (S214). As described above, in a case where the data of the second pattern is input, the dimming unit 34 generates the second data data2 by performing a dimming process on the first data data1 corresponding to sub-pixels positioned at the upper edge while passing through steps S202 to S214.

In a case where it is decided in step S202 that the pattern of the data is the third pattern, the dimming unit 34 decides whether or not the first data data1 is supplied to the first pixel (S304).

If it is decided in step S304 that the first data data1 is supplied to the first pixel, the dimming unit 34 decides whether the pattern of the data is the first or third pattern (S306). Here, the pattern of the data has been decided as the third pattern in step S202, and hence the dimming unit 34 generates the second data data2 by performing a dimming process on the first data data1 to be supplied to the green sub-pixels G1 and G2 and the blue sub-pixel B, which are included in the first pixel (S308) (dimming process of B, G and G positioned at upper edge/left edge of FIG. 3C).

In a case where the first data data1 does not correspond to the first pixel in step S304, the dimming unit 34 decides whether or not the first data data1 is input to the last pixel of the first line (S310). If it is decided in step S310 that the first data data1 is supplied to the last pixel, the dimming unit 34 decides whether the pattern of the data is the second or fourth pattern (S312). Here, the pattern of the data has been decided as the third pattern in step S202, and hence the dimming unit 34 performs a dimming process of the first data data1 corresponding to the green sub-pixels G1 and G2 (S314) (dimming process of G and G positioned at upper edge/right edge of FIG. 3C). Meanwhile, in a case where it is not decided in step S310 that the first data data1 is input to the last pixel, i.e., in a case where the first data data1 is input to one of the pixels between the first and last pixels, the dimming unit 34 performs a dimming process corresponding the green sub-pixels G1 and G2 (S314). As described above, in a case where the data of the third pattern is input, the dimming unit 34 generates the second data data2 by performing a dimming process on the first data data1 corresponding to the sub-pixels positioned at the upper edge while passing through step S202, and S304 to S314.

In a case where it is decided in step S202 that the pattern of the data is the fourth pattern, the dimming unit 34 decides whether or not the first data data1 is supplied to the first pixel (S304).

If it is decided in step S304 that the first data data1 is supplied to the first pixel, the dimming unit 34 decides whether the pattern of the data is the first or third pattern (S306). Here, the pattern of the data has been decided as the fourth pattern in step S202, and hence the dimming unit 34 generates the second data data2 by performing a dimming process on the first data data1 to be supplied to the green sub-pixels G1 and G2 included in the first pixel (S314) (dimming process of G and G positioned at upper edge/left edge of FIG. 3D).

In a case where the first data data1 does not correspond to the first pixel in step S304, the dimming unit 34 decides whether or not the first data data1 is input to the last pixel (S310). If it is decided in step S310 that the first data data1 is supplied to the last pixel, the dimming unit 34 decides whether the pattern of the data is the second or fourth pattern (S312). Here, the pattern of the data has been decided as the fourth pattern in step S202, and hence the dimming unit 34 generates the second data data2 by performing a dimming process on the first data data1 to be supplied to the green sub-pixels G1 and G2 and the blue sub-pixel B, which are included in the last pixel (S308) (dimming process of G, G and B positioned at upper edge/right edge of FIG. 3D). Meanwhile, in a case where it is not decided in step S310 that the first data data1 is input to the last pixel, i.e., in a case where the first data data1 is input to one of the pixels between the first and last pixels, the dimming unit 34 generates the second data data2 by performing a dimming process on the first data data1 corresponding to the sub-pixels positioned at the upper edge while passing through steps S202 and S304 to S314.

Meanwhile, it is not decided in step S200 that the first data data1 is the data to be supplied to the first line, the dimming unit 34 decides whether or not the first data data1 is a data to be supplied to the last line (S300). In a case where it is decided in step S300 that the first data data1 is the data to be supplied to the last line, the dimming unit 34 checks a pattern of the data (S302).

In a case where it is decided in step S302 that the pattern of the data is the first pattern, the dimming unit 34 decides whether the first data data1 is supplied to the first or last pixel of the last line (S304 and S310). In a case where it is decided in step S304 that the first data data1 is supplied to the first pixel, the dimming unit 34 decides whether the pattern of the data is the first or third pattern (S306). Here, the pattern of the data has been decided as the first pattern in step S302, and hence the dimming unit 34 generates the second data data2 by performing a dimming process on the first data data1 to be supplied to the green pixels G1 and G2 and the blue pixel B, which are included in the first pixel (S308) (dimming process of B, G and G positioned at lower edge/left edge of FIG. 3A).

In a case where it is decided in step S310 that the first data data1 is supplied to the last pixel, the dimming unit 34 decides whether the pattern of the data is the second or fourth pattern (S312). Here, the pattern of the data has been decided as the first pattern in step S302, the dimming unit 34 generated the second data data2 by performing a dimming process on the first data data1 to be supplied to the green sub-pixels G1 and G2 included in the last pixel (S314) (dimming process of G and G positioned at lower edge/right edge of FIG. 3A). Meanwhile, it is not decided in step S310 that the first data data1 is not input to the last pixel, i.e., in a case where the first data data1 is input to one of the pixels between the first and last pixels, the dimming unit 34 performs a dimming process of the first data data1 corresponding to the green sub-pixels G1 and G2 (S314). As described above, in a case where the data of the first pattern is input, the dimming unit 34 generates the second data data2 by performing a dimming process on the first data data1 corresponding to sub-pixels positioned at a lower edge while passing through steps S302 to S314.

In a case where it is decided in step S302 that the pattern of the data is the second pattern, the dimming unit 34 decides whether the first data data1 is supplied to the first or last pixel (S304 and S310). In a case where it is decided in step 304 that the first data data1 is supplied to the first pixel, the dimming unit 34 decides whether the pattern of the data is the first or third pattern (S306). Here, the pattern of the data has been decided as the second pattern in step S302, and hence the dimming unit 34 generates the second data data2 by performing a dimming process on the first data data1 to be supplied to the green sub-pixels G1 and G2 included in the first pixel (S314) (dimming process of G and G positioned at lower edge/left edge of FIG. 3B).

In a case where it is decided in step S310 that the first data data1 is supplied to the last pixel, the dimming unit 34 decides whether the pattern of the data is the second or fourth pattern (S312). Here, the pattern of the data has been decided as the second pattern in step S302, and hence the dimming unit 34 generates the second data data2 by performing a dimming process on the first data data1 to be supplied to the green sub-pixels G1 and G2 and the blue sub-pixel B, which are included in the last pixel (S308) (dimming process of G, G and B positioned at lower edge/right edge of FIG. 3B). Meanwhile, in a case where it is not decided in step S310 that the first data data1 is input to the last pixel, i.e., in a case where the first data data1 is input to one of the pixels between the first and last pixels, the dimming unit 34 performs a dimming process on the first data data1 corresponding to the green sub-pixels G1 and G2 (S314). As described above, in a case where the data of the second pattern is input, the dimming unit 34 generates the second data data2 by performing a dimming process on the first data data1 corresponding to the sub-pixels positioned at the lower edge while passing through steps S302 to S314.

In a case where it is decided in step S302 that the pattern of the data is the third pattern, the dimming unit 34 decides whether the first data data1 is supplied to the first or last pixel (S204 and S210). In a case where it is decided at step S204 that the first data data1 is supplied to the first pixel, the dimming unit 34 decides whether the pattern of the data is the second or fourth pattern (S206). Here, the pattern of the data has been decided as the third pattern in step S302, and hence the dimming unit 34 generates the second data data2 by performing a dimming process on the first data data1 to be supplied to the red and blue sub-pixels R and B included in the first pixel (S214) (dimming process of R and B positioned at lower edge/left edge of FIG. 3C).

In a case where it is decided in step S210 that the first data data1 is supplied to the last pixel, the dimming unit 34 decides whether the pattern of the data is the first or third pattern (S212). Here, the pattern of the data has been decided as the third pattern in step S302, and hence the dimming unit 34 generates the second data data2 by performing a dimming process on the first data data1 to be supplied to the red, blue and green sub-pixels R, B and G included in the last pixel (S208) (dimming process of R, B and G positioned at lower edge/right edge of FIG. 3C). Meanwhile, in a case where it is not decided in step S210 that the first data data1 is input to the last pixel, i.e., in a case where the first data data1 is input to one of the pixels between the first and last pixels, the dimming unit 34 performs a dimming process on the first data data1 corresponding to the red and blue sub-pixels R and B (S214). As described above, in a case where the data of the third pattern is input, the dimming unit 34 generates the second data data2 by performing a dimming process on the first data data1 corresponding to the sub-pixels positioned at the lower edge while passing through steps S302 and S204 to S214.

In a case where it is decided in step S302 that the pattern of the data is the fourth pattern, the dimming unit 34 decides whether the first data data1 is supplied to the first or last pixel (S204 and S210). In a case where it is decided in step S204 that the first data data1 is supplied to the first pixel, the dimming unit 34 decides whether the pattern of the data is the second or fourth pattern (S206). Here, the pattern of the data has been decided as the fourth pattern in step S302, and hence the dimming unit 34 generates the second data data2 by performing a dimming process on the first data data1 to be supplied to the red, blue and green sub-pixels R, B and G2 included in the first pixel (S208) (dimming process of G, B and R positioned at lower edge/left edge of FIG. 3D).

In a case where it is decided in step S210 that the first data data1 is supplied to the last pixel, the dimming unit 34 decides whether the pattern of the data is the first or third pattern (S212). Here, the pattern of the data has been decided as the fourth pattern in step S302, and hence the dimming unit 34 generates the second data data2 by performing a dimming process on the first data data1 to be supplied to the red and blue sub-pixels R and B included in the last pixel (S214) (dimming process of R and B positioned at lower edge/right edge) of FIG. 3D). Meanwhile, in a case where it is not decided in step S210 that the first data data1 is input to the last pixel, i.e., in a case where the first data data1 is input to one of the pixels between the first and last pixels, the dimming unit 34 performs a dimming process on the first data data1 corresponding to the red and blue sub-pixels R and B (S214). As described above, in a case where the data of the fourth pattern is input, the dimming unit 34 generates the second data data2 by performing a dimming process on the first data data1 corresponding to the sub-pixels positioned at the lower edge while passing through steps S302 and S204 to S214.

Meanwhile, in a case where it is not decided in step S300 that the first data data1 is the data to be supplied to the last line, i.e., in a case where the first data data1 is a data to be supplied to one of the lines between the first and last lines, the dimming unit 34 checks a pattern of the data (S400).

In a case where it is decided in step S400 that the pattern of the data is the first or second pattern, the dimming unit 34 decides whether or not the first data data1 is supplied to the first or last sub-pixel (S402 and S411).

In a case where it is decided in step S402 that the first data data1 is a data corresponding to the first sub-pixel, the dimming unit 34 decides whether or not the pattern of the data is the first pattern (S404). In a case where it is decided in step S404 that the pattern of the data is the first pattern, the dimming unit 34 decides whether or not the first data data1 is supplied to an odd-numbered line (S406). In a case where it is decided in step S406 that the first data data1 is supplied to the odd-numbered line, the dimming unit 34 performing a dimming process on the first data data1 by deciding that the first data data1 is a data to be supplied to the red sub-pixel R (S408). In a case where it is decide in step S406 that the first data data1 is not supplied to the odd-numbered line, the dimming unit 34 performs a dimming process on the first data data1 by deciding that the first data data1 is a data to be supplied to the blue sub-pixel B (S410).

In a case where it is not decided in step S404 that the pattern of the data is the first pattern, the dimming unit 34 decides whether or not the first data data1 is supplied to the odd-numbered line (S414). In a case where it is decided in step S414 that the first data data1 is supplied to the odd-numbered line, the dimming unit 34 performs a dimming process on the first data data1 by deciding that the first data data1 is a data to be supplied to the green sub-pixel G2 (S416). In a case where it is decided in step S414 that the first data data1 is not supplied to the odd-numbered line, the dimming unit 34 performs a dimming process on the first data data1 by deciding that the first data data1 is the data to be supplied to the green sub-pixel G1 (S418).

In a case where it is decided in step S411 that the first data data1 is a data corresponding to the last sub-pixel, the dimming unit 34 whether or not the pattern of the data is the first pattern (S412). In a case where it is decided in step S412 that the pattern of the data is the first pattern, the dimming unit 34 decides whether or not the first data data1 is supplied to the odd-numbered line (S414). In a case where it is decided in step S414 that the first data data1 is supplied to the odd-numbered line, the dimming unit 34 performs a dimming process on the first data data1 by deciding that the first data data1 is the data to be supplied to the green sub-pixel G2 (S416). In a case where it is decided in step S414 that the first data data1 is not supplied to the odd-numbered line, the dimming unit 34 performs a dimming process on the first data data1 by deciding that the first data data1 is the data to be supplied to the green sub-pixel G1 (S418).

In a case where it is not decided in step S412 that the pattern of the data is the first pattern, the dimming unit 34 decides whether or not the first data data1 is supplied to the odd-numbered line (S406). In a case where it is decided in step S406 that the first data data1 is supplied to the odd-numbered line, the dimming unit 34 performs a dimming process on the first data data1 by deciding that the first data data1 is a data to be supplied to the red sub-pixel R (S408).

In a case where it is decided in step S406 that the first data data1 is not supplied to the odd-numbered line, the dimming unit 34 performs a dimming process on the first data data1 by deciding that the first data data1 is a data to be supplied to the blue sub-pixel B (S410).

Practically, in a case where the data of the first or second pattern is input, the dimming unit 34 performs a dimming process on the first data data1 to be supplied to the sub-pixels positioned at edges of the other lines except the first and last lines, i.e., the first and last sub-pixels, using steps S400 to S418.

In a case where it is decided in step S400 that the pattern of the data is the third or fourth pattern, the dimming unit 34 decides whether the first data data1 is supplied to the first or last sub-pixel (S421 and S425).

In a case where it is decided in step S421 that the first data data1 is a data corresponding to the first sub-pixel, the dimming unit 34 decides whether or not the pattern of the data is the third pattern (S420). In a case where it is decided in step S420 that the pattern of the data is the third pattern, the dimming unit 34 decides whether or not the first data data1 is supplied to the odd-numbered line (S422). In a case where it is decided in step S422 that the first data data1 is supplied to the odd-numbered line, the dimming unit 34 performs a dimming process of the first data data1 by deciding that the first data data1 is a data to be supplied to the blue sub-pixel B (S410). In a case where it is decided in step S422 that the first data data1 is not supplied to the odd-numbered line, the dimming unit 34 performs a dimming process on the first data data1 by deciding that the first data data1 is a data to be supplied to the red sub-pixel R (S408).

In a case where it is not decided in step S420 that the pattern of the data is the third pattern, the dimming unit 34 decides whether or not the first data data1 is supplied to the odd-numbered line (S424). In a case where it is decided in step S424 that the first data data1 is supplied to the odd-numbered line, the dimming unit 34 performs a dimming process of the first data data1 by deciding that the first data data1 is a data to be supplied to the green sub-pixel G1 (S418). In a case where it is decided in step S424 that the first data data1 is not supplied to the odd-numbered line, the dimming unit 34 performs a dimming process on the first data data1 by deciding that the first data data1 is a data to be supplied to the green sub-pixel G2 (S416).

In a case where it is decided in step S425 that the first data data1 is a data corresponding to the last sub-pixel, the dimming unit 34 decides whether or not the pattern of the data is the third pattern (S426). In a case where it is decided in step S426 that the pattern of the data is the third pattern, the dimming unit 34 decides whether or not the first data data1 is supplied to the odd-numbered line (S424). In a case where it is decided in step S424 that the first data data1 is supplied to the odd-numbered line, the dimming unit 34 performs a dimming process of the first data data1 by deciding that the first data data1 is the data to be supplied to the green sub-pixel G1 (S418). In a case where it is decided in step S424 that the first data data1 is not supplied to the odd-numbered line, the dimming unit 34 performs a dimming process on the first data data1 by deciding that the first data data1 is the data to be supplied to the green sub-pixel G2 (S416).

In a case where it is not decided in step S426 that the pattern of the data is the third pattern, the dimming unit 34 decides whether or not the first data data1 is supplied to the odd-numbered line (S422). In a case where it is decided in step S422 that the first data data1 is supplied to the odd-numbered line, the dimming unit 34 performs a dimming process on the first data data1 by deciding that the first data data1 is a data to be supplied to the blue sub-pixel B (S410). In a case where it is decided in step S422 that the first data data1 is not supplied to the odd-numbered line, the dimming unit 34 performs a dimming process on the first data data1 by deciding that the first data data1 is a data to be supplied to the red sub-pixel R (S408).

Practically, in a case where the data of the third or fourth pattern is input, the dimming unit 34 performs a dimming process while repetitively performing the aforementioned procedure on the sub-pixels positioned at the edges of the other lines except the first and last lines, i.e., the first and last sub-pixels.

As described above, the dimming unit 34 performs a dimming process on data to be supplied to the sub-pixels positioned at the edges of the panel corresponding to the first, second, third and fourth patterns of the data while being driven as shown in FIG. 6. Here, a dimming value corresponding to each of the sub-pixels R, B, G1 and G2 is experimentally determined in consideration of the resolution, inch and light emitting efficiency of the panel. For example, the dimming unit 34 may generate the second data data2 by performing a dimming process on the first data data1 so that the luminance of the sub-pixels is lowered by a factor of ½, corresponding to the red and blue sub-pixels R and B. The dimming unit 34 may generate the second data data2 by performing a dimming process on the first data data1 so that the luminance of the green sub-pixel G1 is lowered by a factor of ⅗ and the luminance of the green sub-pixel G2 is lowered to 4/7.

That is, the dimming unit 34 can detect the red sub-pixel R, the blue sub-pixel B and the green sub-pixels G1 and G2, which are positioned at the edges of the panel, while being driven as shown in FIG. 5. Accordingly, various dimming processes are possible.

While the various features and aspects have been described in connection with certain exemplary embodiments, it is to be understood that the invention is not limited to the disclosed embodiments, but, on the contrary, is intended to cover various modifications and equivalent arrangements.

What is claimed is:

1. A portable device comprising:
    a display panel having a pixel arrangement structure comprising a plurality of sub-pixels for displaying an image, the plurality of sub-pixels comprising:
        a plurality of first sub-pixels aligned with each other along a second direction, wherein only the first sub-pixels are aligned with each other along the second direction; and
        a plurality of second sub-pixels and a plurality of third sub-pixels aligned with each other along a first direction different from the second direction and alternately arranged with each other along the first direction, wherein only the second sub-pixels and the third sub-pixels are aligned with each other along the first direction,
    wherein the plurality of first sub-pixels and the plurality of second sub-pixels are alternately arranged with each other along a third direction different from the first direction and the second direction, each of the first sub-pixels facing two of the second sub-pixels along the third direction, and
    wherein the plurality of first sub-pixels and the plurality of third sub-pixels are alternately arranged with each other along the third direction; and
    a processor configured to receive first data, and to generate second data utilizing the first data.

2. The portable device of claim 1, wherein the display panel further comprises a first edge and a second edge opposite the first edge in the first direction, the first and second edges extending in the second direction.

3. The portable device of claim 2, wherein sub-pixels located at one of the first edge and the second edge from among the plurality of sub-pixels comprise a group of the first sub-pixels arranged along the second direction, and
    wherein sub-pixels located at the other one of the first edge and the second edge from among the plurality of sub-pixels comprise a group of the second sub-pixels and the third sub-pixels arranged along the second direction.

4. The portable device of claim 2, wherein sub-pixels nearest to the first edge from among the plurality of sub-pixels comprise only the first sub-pixels, or comprise only the second sub-pixels and the third sub-pixels.

5. The portable device of claim 2, wherein the second data is generated by performing a sub-pixel rendering process on the first data,
    wherein the plurality of sub-pixels are arranged in a Pentile pixel arrangement, and
    wherein the sub-pixel rendering process is suitable for the Pentile pixel arrangement.

6. The portable device of claim 2, wherein the second data is generated by performing a dimming process on the first data, and
    wherein the dimming process comprises a process of reducing grayscale values of data supplied to at least one of the edges of the display panel from among the first data.

7. The portable device of claim 2, wherein the processor is further configured to adjust brightness of sub-pixels nearest to the first edge from among the plurality of sub-pixels and/or sub-pixels nearest to the second edge from among the plurality of sub-pixels.

8. The portable device of claim 2, wherein the second data is different from the first data and comprising rendered data and grayscale value adjusted data of the first data.

9. The portable device of claim 2, wherein the portable device further comprises a data driver configured to receive the second data, and to provide the second data to the plurality of first sub-pixels, the plurality of second sub-pixels, and the plurality of third sub-pixels, and
    wherein the data driver is to receive the second data from the processor.

10. The portable device of claim 2, wherein the first sub-pixels are smaller than the second sub-pixels and the third sub-pixels.

11. The portable device of claim 2, wherein the plurality of sub-pixels are organized as first sub-pixel sets and second sub-pixel sets alternately arranged along the second direction, the first sub-pixel sets comprising only the first sub-pixels, and the second sub-pixels sets comprising only the second sub-pixels and the third sub-pixels.

12. The portable device of claim 2, wherein at least two of the first sub-pixels are alternately arranged only with the second sub-pixels along the third direction or a fourth direction crossing the third direction, and
    wherein at least two of the first sub-pixels are alternately arranged only with the third sub-pixels along the third direction or the fourth direction.

13. The portable device of claim 2, wherein the plurality of sub-pixels are organized as:

a plurality of first sub-pixel groups, each of the first sub-pixel groups comprising a first one of the first sub-pixels and one of the second sub-pixels neighboring the first one of the first sub-pixels; and a plurality of second sub-pixel groups, each of the second sub-pixel groups comprising a second one of the first sub-pixels and one of the third sub-pixels neighboring the second one of the first sub-pixels, wherein the first sub-pixel groups and the second sub-pixel groups are alternately arranged along the first direction and the second direction.

14. The portable device of claim 13, wherein the first sub-pixels in the first sub-pixel groups are elongated in a fourth direction crossing the third direction, and wherein the first sub-pixels in the second sub-pixel groups are elongated in the third direction.

15. The portable device of claim 2, wherein centers of two adjacent ones of the second sub-pixels and centers of two adjacent ones of the third sub-pixels are located at respective vertices of a virtual quadrangle, and one of the first sub-pixels is located in the virtual quadrangle.

16. The portable device of claim 2, wherein centers of four nearest ones of the first sub-pixels are located at vertices of a virtual quadrangle, and only one of the second sub-pixels or only one of the third sub-pixels is located within the virtual quadrangle.

17. The portable device of claim 1, wherein the plurality of sub-pixels are organized as a plurality of first sub-pixel rows and a plurality of second sub-pixel rows that are alternately arranged along the third direction, each of the first sub-pixel rows comprising only the first sub-pixels and the second sub-pixels, each of the second sub-pixel rows comprising only the first sub-pixels and the third sub-pixels, wherein each of the first sub-pixel rows is configured to produce light of a first mixed color when all of the sub-pixels arranged along a fourth direction crossing the third direction on the first sub-pixel row are concurrently driven, and wherein each of the second sub-pixel rows is configured to produce light of a second mixed color different from the first mixed color when all of the sub-pixels arranged along the fourth direction on the second sub-pixel row are concurrently driven.

18. The portable device of claim 17, wherein the sub-pixels on the plurality of first sub-pixel rows have two different sizes, and the sub-pixels on the plurality of second sub-pixel rows have two different sizes, and wherein the first sub-pixels on the plurality of first sub-pixel rows are oriented differently from the first sub-pixels on the plurality of second sub-pixel rows.

19. The portable device of claim 17, wherein the first mixed color is cyan and the second mixed color is yellow, and wherein the first sub-pixels, the second sub-pixels, and the third sub-pixels comprise self-luminescent elements.

20. The portable device of claim 19, wherein the first sub-pixels comprise first organic light emitting diodes configured to emit light of a first color, wherein the second sub-pixels comprise second organic light emitting diodes configured to emit light of a second color, and wherein the third sub-pixels comprise third organic light emitting diodes configured to emit light of a third color, and wherein the first color is green, the second color is blue, and the third color is red.

21. The portable device of claim 1, wherein a first side of one of the first sub-pixels is generally parallel to a facing side of an adjacent one of the second sub-pixels, and a second side of the one of the first sub-pixels is generally parallel to a facing side of an adjacent one of the third sub-pixels.

22. The portable device of claim 1, wherein a set of the first sub-pixels is generally aligned with a set of the second sub-pixels along the third direction, and wherein another set of the first sub-pixels is generally aligned with a set of the third sub-pixels along the third direction.

23. The portable device of claim 1, wherein the plurality of sub-pixels are arranged in an RGBG structure, in which a number of the first sub-pixels is twice a number of the second sub-pixels, and a number of the third sub-pixels is the same as the number of the second sub-pixels.

24. The portable device of claim 1, wherein at least one of the first sub-pixels or at least one of the third sub-pixels is generally located between any two of the second sub-pixels, and wherein at least one of the first sub-pixels or at least one of the second sub-pixels is generally located between any two of the third sub-pixels.

25. The portable device of claim 1, wherein the plurality of sub-pixels are organized as a plurality of pixel units, each of the pixel units consisting of two of the first sub-pixels, one of the second sub-pixels, and one of the third sub-pixels, wherein the plurality of pixel units are arranged along the first direction into a plurality of pixel unit rows that are arranged along the second direction, two neighboring ones of the pixel units in the first direction being immediately adjacent each other.

26. The portable device of claim 25, wherein the two of the first sub-pixels are elongated in different directions from each other.

27. The portable device of claim 25, wherein the plurality of sub-pixels comprises organic light emitting elements.

28. The portable device of claim 27, wherein the plurality of first sub-pixels comprises first organic light emitting diodes configured to emit light of a first color, wherein the plurality of second sub-pixels comprises second organic light emitting diodes configured to emit light of a second color, and wherein the plurality of third sub-pixels comprises third organic light emitting diodes configured to emit light of a third color.

29. The portable device of claim 28, wherein the plurality of first sub-pixels have a narrower area than the plurality of second sub-pixels and the third sub-pixels, and wherein the second sub-pixels have a wider area than the third sub-pixels.

30. The portable device of claim 28, wherein the first color is green, the second color is blue, and the third color is red.

* * * * *

UNITED STATES PATENT AND TRADEMARK OFFICE
CERTIFICATE OF CORRECTION

| | | |
|---|---|---|
| PATENT NO. | : 11,594,175 B2 | Page 1 of 1 |
| APPLICATION NO. | : 17/580484 | |
| DATED | : February 28, 2023 | |
| INVENTOR(S) | : Ji-Yeon Yang et al. | |

It is certified that error appears in the above-identified patent and that said Letters Patent is hereby corrected as shown below:

On the Title Page

Column 1, after item (63)    Insert -- (30) Foreign Application Priority Data
                             Sep. 12, 2012 (KR) ................. 10-2012-0100881 --

Signed and Sealed this
Ninth Day of May, 2023

Katherine Kelly Vidal
*Director of the United States Patent and Trademark Office*